United States Patent
Park et al.

(10) Patent No.: US 10,128,050 B1
(45) Date of Patent: Nov. 13, 2018

(54) COMPOSITE ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Se Hun Park, Suwon-si (KR); Gu Won Ji, Suwon-si (KR); Heung Kil Park, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/834,863

(22) Filed: Dec. 7, 2017

(30) Foreign Application Priority Data

Sep. 27, 2017 (KR) ........................ 10-2017-0125283

(51) Int. Cl.
 *H01G 4/30* (2006.01)
 *H05K 1/18* (2006.01)
 *H05K 1/11* (2006.01)
 *H01G 4/005* (2006.01)
 (Continued)

(52) U.S. Cl.
 CPC .............. *H01G 4/30* (2013.01); *H01G 4/005* (2013.01); *H01G 4/12* (2013.01); *H01G 4/248* (2013.01); *H05K 1/111* (2013.01); *H05K 1/181* (2013.01); *H05K 2201/10015* (2013.01)

(58) Field of Classification Search
 CPC ... H05K 1/02; H05K 1/03; H05K 1/11; H05K 1/14; H05K 1/01; H01G 4/00; H01G 4/01; H01G 4/05; H01G 4/06; H01G 4/12; H01G 4/30; H01G 4/40; H01G 2/06

USPC ............. 174/260, 258; 361/15, 301.1, 301.3, 361/301.4, 303, 306.3, 767, 768, 782; 29/832
 See application file for complete search history.

(56) References Cited

U.S. PATENT DOCUMENTS

| 6,418,007 | B1 * | 7/2002 | Lacy ..................... | H01G 4/255 361/301.1 |
| 8,988,853 | B2 * | 3/2015 | Kim ..................... | H01G 4/228 361/301.4 |
| 9,633,790 | B1 * | 4/2017 | Kim ..................... | H01G 4/30 |

(Continued)

FOREIGN PATENT DOCUMENTS

| JP | 2004-134430 A | 4/2004 |
| JP | 2012-204572 A | 10/2012 |

(Continued)

*Primary Examiner* — Xiaoliang Chen
(74) *Attorney, Agent, or Firm* — McDermott Will & Emery LLP (57) ABSTRACT

A composite electronic component includes: a composite body in which a multilayer ceramic capacitor and a ceramic chip are coupled to each other. The multilayer ceramic capacitor includes a first ceramic body, and first and second external electrodes disposed on both end portions of the first ceramic body. The ceramic chip includes a second ceramic body disposed on a lower portion of the multilayer ceramic capacitor, and first and second terminal electrodes disposed on both end portions of the second ceramic body and connected to the first and second external electrodes. A width of first regions of the second ceramic body in which the first and second terminal electrodes are disposed is wider than a width of a second region of the second ceramic body between the first regions.

12 Claims, 7 Drawing Sheets

(51) Int. Cl.
*H01G 4/248* (2006.01)
*H01G 4/12* (2006.01)

(56) References Cited

U.S. PATENT DOCUMENTS

| | | | | |
|---|---|---|---|---|
| 9,928,957 B2* | 3/2018 | Park | ............ | H01G 4/005 |
| 2004/0066589 A1* | 4/2004 | Togashi | ............ | H01G 2/065 |
| | | | | 361/15 |
| 2008/0297978 A1* | 12/2008 | Ohaga | ............ | H01G 4/105 |
| | | | | 361/321.4 |
| 2013/0284507 A1* | 10/2013 | Hattori | ............ | H05K 1/18 |
| | | | | 174/260 |
| 2014/0016242 A1* | 1/2014 | Hattori | ............ | H01G 2/06 |
| | | | | 361/303 |
| 2014/0083755 A1* | 3/2014 | Lee | ............ | H05K 1/181 |
| | | | | 174/260 |
| 2014/0116768 A1* | 5/2014 | Hattori | ............ | H01G 2/065 |
| | | | | 174/260 |
| 2014/0124256 A1* | 5/2014 | Hattori | ............ | H01G 2/065 |
| | | | | 174/260 |
| 2014/0160616 A1* | 6/2014 | Yoon | ............ | H01G 4/12 |
| | | | | 361/301.4 |
| 2014/0160618 A1* | 6/2014 | Yoon | ............ | H01G 4/30 |
| | | | | 361/301.4 |
| 2014/0160621 A1* | 6/2014 | Yoon | ............ | H01G 4/30 |
| | | | | 361/301.4 |
| 2014/0168851 A1* | 6/2014 | Lee | ............ | H01G 4/30 |
| | | | | 361/303 |
| 2014/0268487 A1* | 9/2014 | Yoshida | ............ | H01G 2/065 |
| | | | | 361/301.4 |
| 2015/0026972 A1* | 1/2015 | Ogawa | ............ | H05K 3/0052 |
| | | | | 29/832 |
| 2015/0026973 A1* | 1/2015 | Ogawa | ............ | H05K 3/0052 |
| | | | | 29/832 |
| 2015/0122534 A1* | 5/2015 | Park | ............ | H01G 2/065 |
| | | | | 174/260 |
| 2015/0131252 A1* | 5/2015 | Park | ............ | H05K 1/181 |
| | | | | 361/782 |
| 2015/0131253 A1* | 5/2015 | Park | ............ | H01G 2/06 |
| | | | | 361/782 |
| 2016/0007446 A1* | 1/2016 | Ishikawa | ............ | H05K 1/113 |
| | | | | 174/260 |
| 2016/0088733 A1* | 3/2016 | Lee | ............ | H05K 3/3442 |
| | | | | 361/768 |
| 2016/0111215 A1* | 4/2016 | Park | ............ | H01C 1/14 |
| | | | | 174/260 |
| 2016/0120027 A1* | 4/2016 | Park | ............ | H01G 4/30 |
| | | | | 174/260 |
| 2016/0133386 A1* | 5/2016 | Park | ............ | H01G 4/40 |
| | | | | 361/767 |
| 2016/0196921 A1* | 7/2016 | Oh | ............ | H01G 4/30 |
| | | | | 174/260 |
| 2016/0205769 A1* | 7/2016 | Park | ............ | H01G 4/224 |
| | | | | 174/260 |
| 2016/0309578 A1* | 10/2016 | Park | ............ | H01G 4/30 |
| 2017/0086297 A1* | 3/2017 | Sakamoto | ............ | H01G 2/06 |
| 2017/0105283 A1* | 4/2017 | Kim | ............ | H05K 1/0271 |
| 2017/0171980 A1* | 6/2017 | Hattori | ............ | H05K 1/185 |
| 2017/0359900 A1* | 12/2017 | Sakamoto | ............ | H01G 4/30 |

FOREIGN PATENT DOCUMENTS

JP 2014-179512 A 9/2014
WO 2012/090986 A1 7/2012

* cited by examiner

COMPOSITE ELECTRONIC COMPONENT AND BOARD HAVING THE SAME

CROSS-REFERENCE TO RELATED APPLICATION(S)

This application claims benefit of priority to Korean Patent Application No. 10-2017-0125283 filed on Sep. 27, 2017 in the Korean Intellectual Property Office, the disclosure of which is incorporated herein by reference in its entirety.

TECHNICAL FIELD

The present disclosure relates to a composite electronic component and a board having the same.

BACKGROUND

A multilayer ceramic capacitor, a multilayer chip electronic component, is a chip type condenser mounted on the printed circuit boards of several electronic products such as display devices including liquid crystal displays (LCDs), plasma display panels (PDPs), or the like, computers, personal digital assistants (PDAs), mobile phones, and the like, serving to charge or discharge electricity.

Such a multilayer ceramic capacitor (MLCC) may be used as a component in various electronic apparatuses due to advantages such as a small size, high capacitance, and ease of mountability.

The multilayer ceramic capacitor may have a structure in which a plurality of dielectric layers and internal electrodes having different polarities are disposed between the dielectric layers and are alternately stacked.

Since the dielectric layer as described above has piezo-electricity and electrostriction, when a direct current (DC) or alternating current (AC) voltage is applied to the multilayer ceramic capacitor, a piezoelectric phenomenon may occur between the internal electrodes, causing vibrations.

These vibrations may be transferred to a printed circuit board on which the multilayer ceramic capacitor is mounted through external electrodes of the multilayer ceramic capacitor, such that an entire printed circuit board becomes a sound reflecting surface to transmit the sound of vibrations as noise.

The sound of vibrations may correspond to an audio frequency range of 20 Hz to 20,000 Hz, potentially causing user discomfort. The vibration noise causing listener discomfort as described above is known as acoustic noise.

In accordance with the recent trend for slimness and miniaturization of electronic devices, such a multilayer ceramic capacitor has been used together with a printed circuit board in an environment of high voltage and large voltage change, and thus, the acoustic noise may be sufficiently recognized by a user.

Therefore, a novel product capable of decreasing acoustic noise has been continuously demanded.

SUMMARY

An aspect of the present disclosure may provide a composite electronic component capable of decreasing acoustic noise, a board having the same.

According to an aspect of the present disclosure, a composite electronic component may include: a composite body in which a multilayer ceramic capacitor and a ceramic chip are coupled to each other, the multilayer ceramic capacitor including a first ceramic body in which a plurality of dielectric layers and internal electrodes disposed to face each other with respective dielectric layers interposed therebetween are stacked, and first and second external electrodes disposed on both end portions of the first ceramic body; and the ceramic chip including a second ceramic body disposed on a lower portion of the multilayer ceramic capacitor, and first and second terminal electrodes disposed on both end portions of the second ceramic body and connected to the first and second external electrodes. A width of first regions of the second ceramic body in which the first and second terminal electrodes are disposed is wider than a width of a second region of the second ceramic body between the first regions.

According to another aspect of the present disclosure, a composite electronic component may include: a composite body in which a multilayer ceramic capacitor and a ceramic chip are coupled to each other, the multilayer ceramic capacitor including a first ceramic body in which a plurality of dielectric layers and internal electrodes disposed to face each other with respective dielectric layers interposed therebetween are stacked, and first and second external electrodes disposed on both end portions of the first ceramic body; and the ceramic chip including a second ceramic body disposed on a lower portion of the multilayer ceramic capacitor, and first and second terminal electrodes disposed on both end portions of the second ceramic body and connected to the first and second external electrodes. The ceramic chip has a cut portion cut inwardly from both end portions of the ceramic chip in a length direction, and the first and second terminal electrodes are entirely disposed on both end portions of the second ceramic body in the length direction.

According to another aspect of the present disclosure, a board having a composite electronic component may include: a printed circuit board on which a plurality of electrode pads are formed; the composite electronic component as described above, mounted on the printed circuit board; and a solder connecting the electrode pads and the composite electronic component to each other.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Composite Electronic Component

Figure 1:
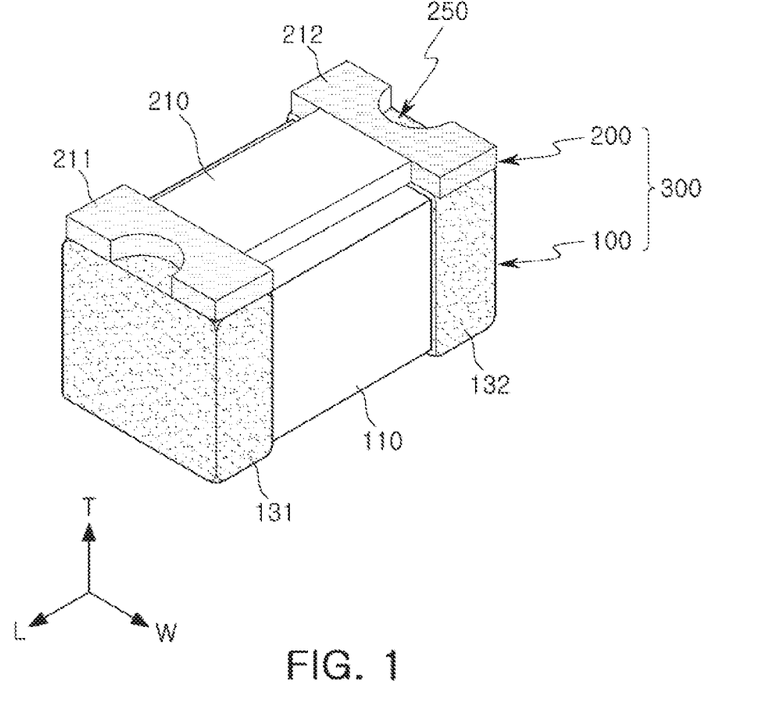
FIG. 1 is a perspective view schematically illustrating a composite electronic component according to an exemplary embodiment in the present disclosure.

FIG. 1 is a perspective view schematically illustrating a composite electronic component according to an exemplary embodiment in the present disclosure.

Figure 2:
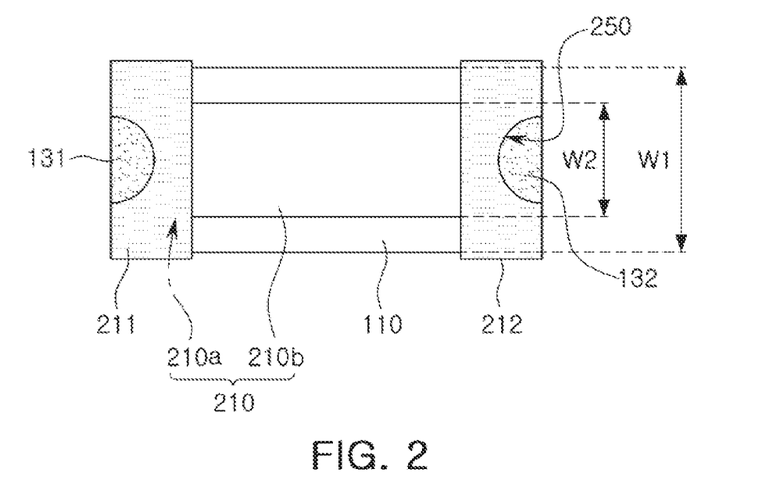
FIG. 2 is a top plan view of the composite electronic component of FIG. 1.

FIG. 2 is a top plan view of the composite electronic component of FIG. 1.

Referring to FIG. 1, in the composite electronic component according to the exemplary embodiment in the present disclosure, a 'length direction' refers to an 'L' direction of FIG. 1, a 'width direction' refers to a 'W' direction of FIG. 1, and a 'thickness direction' refers to a 'T' direction of FIG. 1. Here, the 'thickness direction' may be the same as a direction in which dielectric layers of a capacitor are stacked, that is, a 'stacking direction'.

Meanwhile, in the exemplary embodiment in the present disclosure, the composite electronic component may have upper and lower surfaces opposing each other in the thickness direction, first and second end surfaces in the length direction and third and fourth side surfaces in the width direction that connect the upper and lower surfaces to each other. A shape of the composite electronic component is not particularly limited, but may be a hexahedral shape as illustrated.

In addition, the first and second end surfaces of the composite electronic component in the length direction and the third and fourth side surfaces thereof in the width direction may be defined as surfaces in the same directions as directions of first and second end surfaces of the multilayer ceramic capacitor and the ceramic chip in the length direction and third and fourth side surfaces of the multilayer ceramic capacitor and the ceramic chip in the width direction, respectively, as described below.

Meanwhile, in the composite electronic component, the multilayer ceramic capacitor and the ceramic chip may be coupled to each other, and in a case in which the ceramic chip is coupled to a lower portion of the multilayer ceramic capacitor, the upper surface of the composite electronic component may be defined as an upper surface of the multilayer ceramic capacitor, and a lower surface of the composite electronic component may be defined as a lower surface of the ceramic chip.

Referring to FIGS. 1 and 2, the composite electronic component according to the exemplary embodiment in the present disclosure may include a composite body 300 in which a multilayer ceramic capacitor 100 and a ceramic chip 200 are coupled to each other. The multilayer ceramic capacitor 100 includes a first ceramic body 110 in which a plurality of dielectric layers and internal electrodes disposed to face each other with respective dielectric layers interposed therebetween are stacked and first and second external electrodes 131 and 132 disposed on both end portions of the first ceramic body 110. The ceramic chip 200 includes a second ceramic body 210 disposed on a lower portion of the multilayer ceramic capacitor 100 and first and second terminal electrodes 211 and 212 disposed on both end portions of the second ceramic body 210 and connected to the first and second external electrodes 131 and 132.

According to the exemplary embodiment in the present disclosure, a composite electronic component in which a width W1 of a first region 210a of the second ceramic body 210 in which the first and second terminal electrodes 211 and 212 are disposed is wider than a width W2 of a second region (the other region) 210b of the second ceramic body 210 may be provided.

The first region 210a of the second ceramic body 210 may be defined as regions of the second ceramic body 210 configuring the ceramic chip 200 in which the first and second terminal electrodes 211 and 212 are disposed, and the second region (the other region) 210b of the second ceramic body 210 may be defined as a central region of the second ceramic body 210 in which the first and second terminal electrodes 211 and 212 are not disposed.

Further, the second region (the other region) 210b of the second ceramic body 210 may be a region corresponding to a central region of the first ceramic body 110 configuring the multilayer ceramic capacitor 100 in which the first and second external electrodes 131 and 132 are not disposed.

Meanwhile, the width W1 of the first region 210a of the second ceramic body 210 in which the first and second terminal electrodes 211 and 212 are disposed may be equal to or almost equal to a width of the first ceramic body 110. Therefore, hereinafter, the width of the first ceramic body 110 may also be represented by W1.

According to the exemplary embodiment in the present disclosure, since the width W1 of the first region 210a of the second ceramic body 210 in which the first and second terminal electrodes 211 and 212 are disposed is wider than the width W2 of the second region (the other region) 210b of the second ceramic body 210, a central region of the ceramic chip 200 in the length direction in which the first and second terminal electrodes 211 and 212 are not disposed may have a shape cut in the width direction.

Further, the width W2 of the second region 210b of the second ceramic body 210 may be narrower than the width of the first ceramic body 110 corresponding thereto.

As described above, since the width W1 of the first region 210a of the second ceramic body 210 in which the first and second terminal electrodes 211 and 212 are disposed is almost equal to a width of the first ceramic body 110, the width W2 of the second region 210b of the second ceramic body 210 may be narrower than the width of the first ceramic body 110.

According to the exemplary embodiment of the present disclosure, the ceramic chip 200 may have a cut portion 250 cut inwardly from both end portions of the ceramic chip 200 in the length direction.

The cut portion 250 may have a shape cut inwardly from both end portions of the first region 210a of the second ceramic body 210 in the length direction in which the first and second terminal electrodes 211 and 212 are disposed, and be formed at a predetermined size in central regions of the second ceramic body 210 in the width direction.

According to the related art, research into a composite electronic component in which a printed circuit board was used on a lower surface of a multilayer ceramic capacitor in order to decrease acoustic noise has been conducted.

However, in a case of increasing a thickness of the printed circuit board, an effect of decreasing acoustic noise may be increased, but a side effect of decreasing electrical properties may occur. Therefore, research into a technology capable of efficiently decreasing acoustic noise while significantly decreasing the thickness of the printed circuit board has been required.

In the exemplary embodiment in the present disclosure, the ceramic chip 200 may be disposed below the multilayer ceramic capacitor 100 in order to decrease acoustic noise, but the width W2 of the second region 210b of the second ceramic body may be narrower than the width of the first ceramic body 110 corresponding thereto, and the ceramic chip 200 may have the cut portion 250 cut inwardly from both end portions of the first region 210a of the second ceramic body 210 in the length direction, such that an effect of decreasing acoustic noise may be more excellent, as compared to the composite electronic component according to the related art in which the printed circuit board is used on a lower surface of the multilayer ceramic capacitor.

Particularly, the central portion of the second ceramic body 210 coupled to the first ceramic body 110 in the length direction may be cut, and the cut portion 250 may be further disposed in the central regions of the second ceramic body 210 in the width direction in both end portions of the second ceramic body 210 in the length direction, a step may be formed in the thickness direction, such that the effect of decreasing acoustic noise may be excellent.

That is, the step may be formed in order to form a space capable of being defined as a solder pocket between the multilayer ceramic capacitor 100 and the ceramic chip 200, and the solder pocket or the step may block a solder from being formed in the thickness direction of the multilayer ceramic capacitor 100, such that the transferring of vibrations to the printed circuit board by the solder may be significantly decreased.

In detail, referring to FIG. 2, in the ceramic chip 200, the width W2 of the second region 210b of the second ceramic body 210 may be narrower than the width of the first ceramic body 110 corresponding thereto, and the ceramic chip 200 may have the cut portion 250 cut inwardly from both end portions of the first region 210a of the second ceramic body 210 in the length direction, such that the space capable of being defined as the solder pocket may be formed.

In this case, at the time of mounting the composite electronic component according to the exemplary embodiment in the present disclosure on a printed circuit board and applying a solder, the solder may be mostly filled in the solder pocket, and the residual solder may be applied onto lower surfaces of the first and second external electrodes 131 and 132 of the multilayer ceramic capacitor 100 and side surfaces of the first and second terminal electrodes 211 and 212 of the ceramic chip 200.

Since an amount of the solder applied onto the lower surfaces of the first and second external electrodes 131 and 132 of the multilayer ceramic capacitor 100 and the side surfaces of the first and second terminal electrodes 211 and 212 of the ceramic chip 200 is smaller than that in a structure according to the related art, the transferring of vibrations to the printed circuit board by the solder may be significantly decreased.

According to the exemplary embodiment in the present disclosure, the ceramic chip 200 may be coupled to the lower portion of the multilayer ceramic capacitor 100 to thereby be disposed thereon.

In the ceramic chip 200, the first and second terminal electrodes 211 and 212 connected to the first and second external electrodes 131 and 132 may be disposed on both end portions of the second ceramic body 210 formed of bulk shaped ceramic.

In general, in order to significantly decrease the transferring of vibrations of a multilayer ceramic capacitor to a printed circuit board, there was an attempt to insert an intermediate medium between the multilayer ceramic capacitor and the printed circuit board.

However, since the intermediate medium, which is a resin generally used to manufacture a board, is formed of a material having elasticity, the intermediate medium may serve to absorb vibrations of the multilayer ceramic capacitor through elasticity of the intermediate medium.

On the contrary, according to the exemplary embodiment in the present disclosure, since the second ceramic body 210 of the ceramic chip 200 is formed of only hard ceramic material that is not elastically deformed, the printed circuit board and the multilayer ceramic capacitor 100 may be spaced apart from each other by the ceramic chip 200, thereby blocking vibrations itself generated in the multilayer ceramic capacitor 100 from being transferred.

The ceramic may contain alumina ($Al_2O_3$).

The second ceramic body 210 may be formed of alumina ($Al_2O_3$), thereby suppressing vibrations itself generated in the multilayer ceramic capacitor 100 from being transferred.

The first and second terminal electrodes 211 and 212 may have a double layer structure composed of first and second conductive resin layers at inner portions thereof and first and second plating layers at outer portions thereof.

According to the exemplary embodiment in the present disclosure, in a case in which the first and second terminal electrodes 211 and 212 have the double layer structure composed of the first and second conductive resin layers at inner portions thereof and the first and second plating layers at outer portions thereof as described above, when mechanical stress is applied thereto from the outside, the ceramic chip 200 and the conductive resin layers used as the terminal electrodes 211 and 212 of the ceramic chip 200 may suppress stress from being transferred to the multilayer ceramic capacitor 100, thereby preventing the multilayer ceramic capacitor from being damaged by cracks.

The first and second conductive resin layers may contain a conductive metal and a thermosetting resin, for example, silver (Ag) and an epoxy resin, but are not limited thereto.

The first and second terminal electrodes 211 and 212 may be entirely disposed on both end portions of the second ceramic body 210 in the length direction, such that adhesive force with the external electrodes 131 and 132 of the multilayer ceramic capacitor may be improved.

Figure 3:
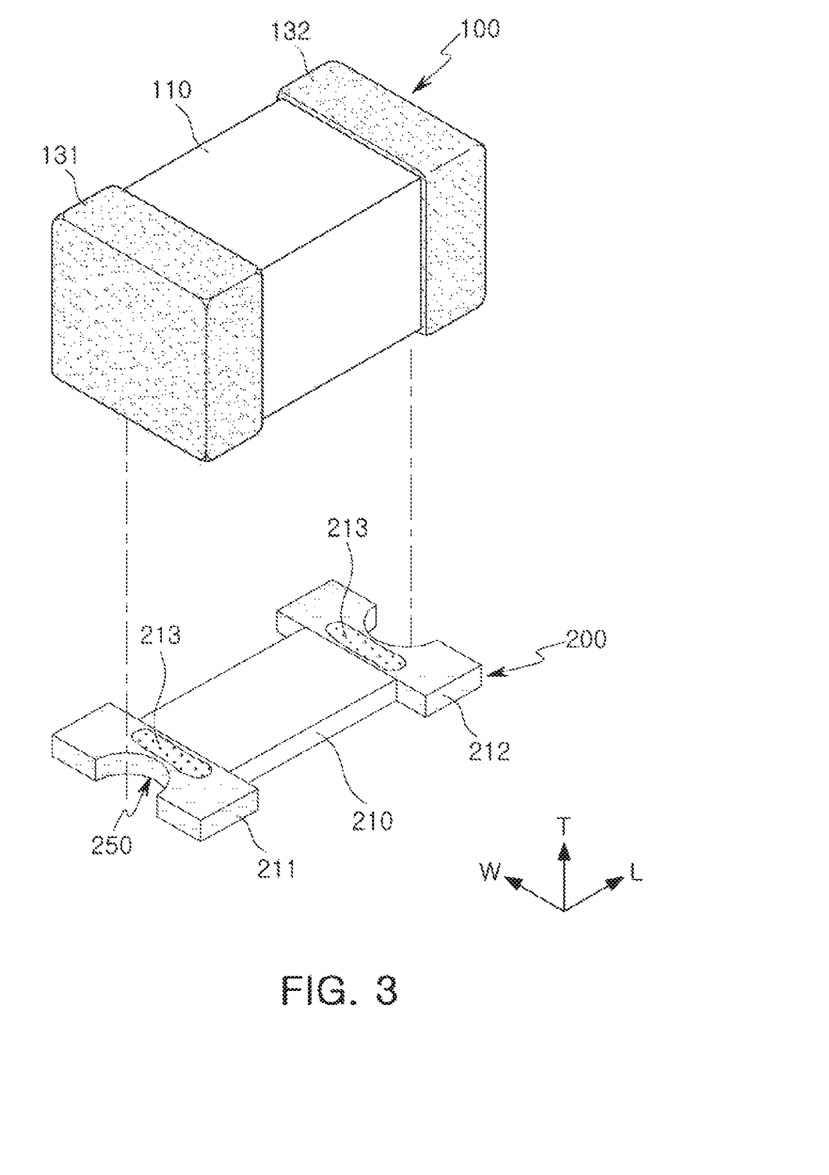
FIG. 3 is an exploded perspective view separately illustrating a multilayer ceramic capacitor and a ceramic chip of the composite electronic component of FIG. 1.

FIG. 3 is an exploded perspective view separately illustrating a multilayer ceramic capacitor and a ceramic chip of the composite electronic component of FIG. 1.

In the present exemplary embodiment, the composite body 300 may be formed by coupling the multilayer ceramic capacitor 100 and the ceramic chip 200 to each other, and a method of forming the composite body 300 is not particularly limited.

For example, as illustrated in FIG. 3, the composite body 300 may be formed by coupling the multilayer ceramic capacitor 100 and the ceramic chip 200 that are separately manufactured to each other using a high melting point solder, a conductive adhesive 213, or the like. In a case in which the conductive adhesive 213 is a high melting point solder, the melting point of the conductive adhesive 213 may be higher than a melting point of a solder filling the solder pocket to electrically connect the composite body 300 to a mounting board. As such, a temperature greater than the melting point of the solder filling the solder pocket but lower than the melting point of the conductive adhesive 213 can be applied at the time of mounting the composite body 300 to the mounting board, so as to ensure an electrical connection between the composite body 300 and the mounting board while securing an existing adhesion between the ceramic capacitor 100 and the ceramic chip 200 by the conductive adhesive 213.

The conductive adhesive 213 may be a paste containing a conductive metal and an epoxy resin, but is not necessarily limited thereto.

In a case of coupling the multilayer ceramic capacitor 100 and the ceramic chip 200 using the high melting point solder, the conductive adhesive 213, or the like, the conductive adhesive 213 may be applied onto the lower surfaces of the first and second external electrodes 131 and 132 to thereby be adhered to the first and second terminal electrodes 211 and 212 of the ceramic chip 200.

The high melting point solder or the conductive adhesive 213 may be applied onto the lower surfaces of the first and second external electrodes 131 and 132 to thereby be fixed to the ceramic chip 200 at the lower surface of the multilayer ceramic capacitor 100, such that only vibrations of a surface (LW surface) of the first ceramic body 110 in a length-width direction may be transferred to the ceramic chip 200.

Therefore, the transferring of stress and vibrations generated in the multilayer ceramic capacitor to the ceramic chip may be significantly decreased, such that acoustic noise may be decreased.

Figure 4:
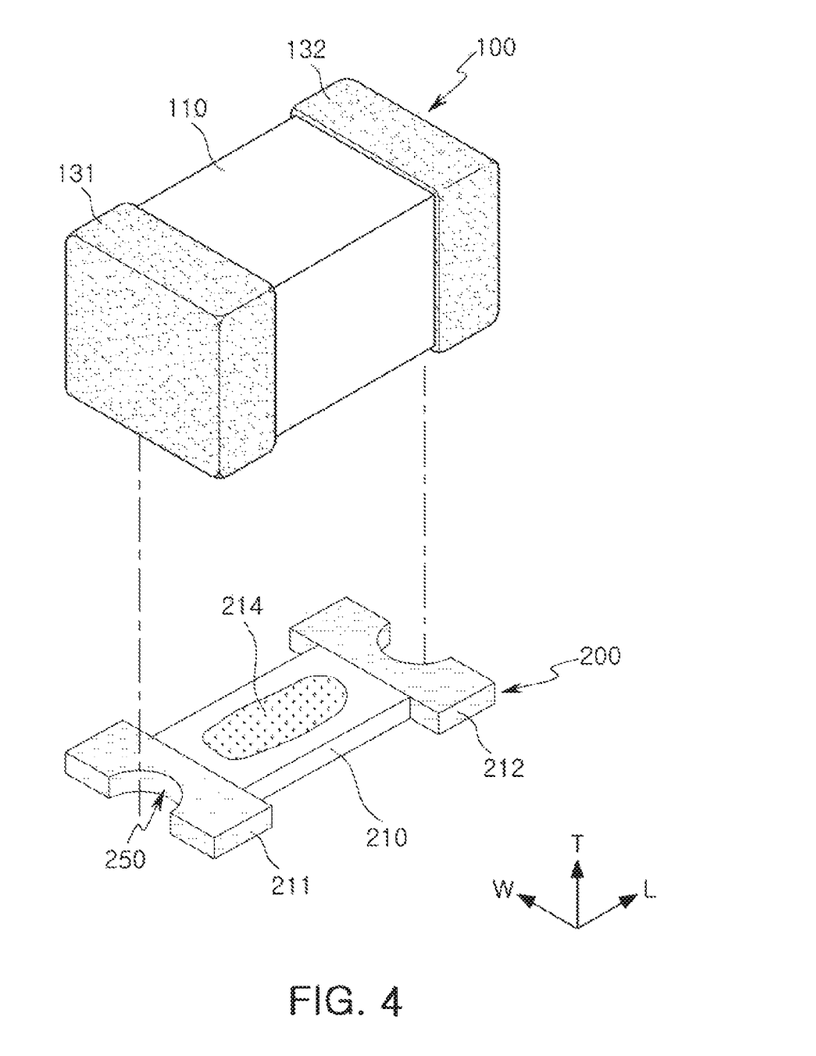
FIG. 4 is an exploded perspective view separately illustrating a multilayer ceramic capacitor and a ceramic chip of another example of the composite electronic component of FIG. 1.

FIG. 4 is an exploded perspective view separately illustrating a multilayer ceramic capacitor and a ceramic chip of another example of the composite electronic component of FIG. 1.

Referring to FIG. 4, as another example of the composite electronic component, the multilayer ceramic capacitor 100 and the ceramic chip 200 may be coupled to each other by an insulating adhesive 214 applied between the lower surface of the first ceramic body 110 of the multilayer ceramic capacitor and an upper surface of the second ceramic body 210 of the ceramic chip 200.

Application of the insulating adhesive 214 between the lower surface of the first ceramic body 110 of the multilayer ceramic capacitor and the upper surface of the second ceramic body 210 of the ceramic chip 200 may mean that the insulating adhesive 214 is applied to ceramic portions of the lower surface of the first ceramic body 110 and the upper surface of the second ceramic body 210 on which the first and second external electrodes and the first and second terminal electrodes are not disposed.

The insulating adhesive 214 is not particularly limited, but may be, for example, an epoxy resin.

Hereinafter, the multilayer ceramic capacitor 100 and the ceramic chip 200 configuring the composite body 300 will be described in detail.

Figure 5:
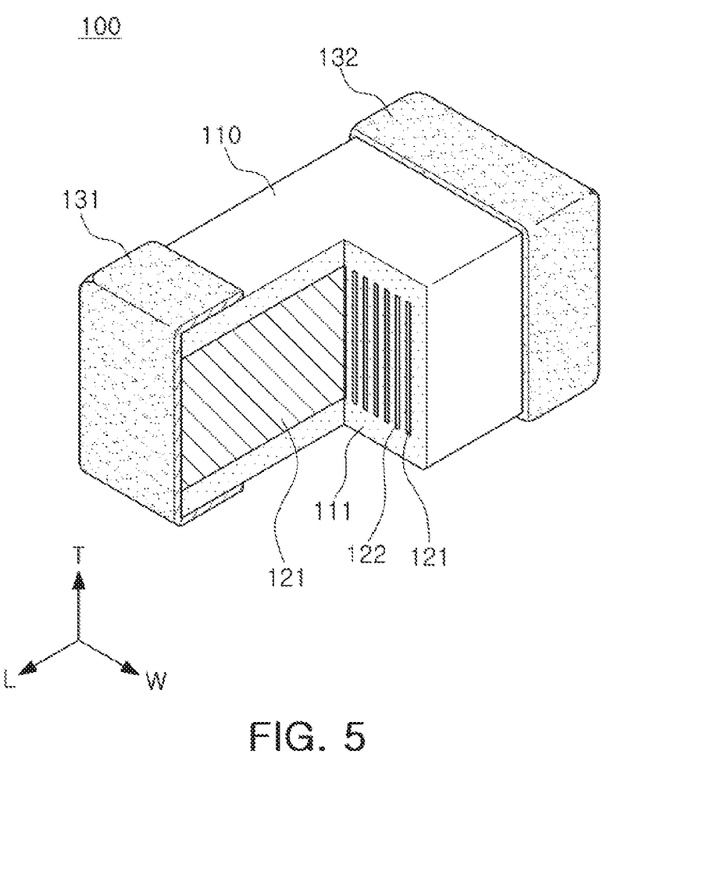
FIG. 5 is a partially cut-away perspective view schematically illustrating the multilayer ceramic capacitor of the composite electronic component of FIG. 1.

FIG. 5 is a partially cut-away perspective view schematically illustrating the multilayer ceramic capacitor of the composite electronic component of FIG. 1.

Referring to FIG. 5, the first ceramic body 110 configuring the multilayer ceramic capacitor 100 may be formed by stacking a plurality of dielectric layers 111, and a plurality of internal electrodes 121 and 122 (sequentially first and second internal electrodes) may be separately disposed in the first ceramic body 110 with respective dielectric layers interposed therebetween.

The plurality of dielectric layers 111 configuring the first ceramic body 110 may be in a sintered state, and adjacent dielectric layers may be integrated with each other so that boundaries therebetween are not readily apparent.

The dielectric layer 111 may be formed by sintering a ceramic green sheet containing ceramic powder, an organic solvent, and an organic binder. The ceramic powder, which is a material having high permittivity, may be a barium titanate ($BaTiO_3$) based material, a strontium titanate ($SrTiO_3$) based material, or the like, but is not limited thereto.

That is, the dielectric layers 111 configuring the first ceramic body 110 may contain a ferroelectric material, but is not necessarily limited thereto.

Meanwhile, according to the exemplary embodiment in the present disclosure, the internal electrodes may include first internal electrodes 121 exposed to the first end surface of the composite body 300 in the length direction and second internal electrodes 122 exposed to the second end surface thereof in the length direction, but the internal electrodes are not necessarily limited thereto.

The first and second internal electrodes 121 and 122 may be formed of a conductive paste containing a conductive metal.

The conductive metal may be nickel (Ni), copper (Cu), palladium (Pd), or an alloy thereof, but is not limited thereto.

The first and second internal electrodes 121 and 122 may be printed on the ceramic green sheets forming the dielectric layers 111, using the conductive paste by a printing method such as screen printing method or a gravure printing method.

The ceramic green sheets on which the internal electrodes are printed may be alternately stacked and sintered, thereby forming the ceramic body.

The plurality of first and second internal electrodes 121 and 122 may be disposed to be perpendicular to the upper and lower surfaces of the first ceramic body 110.

That is, the first and second internal electrodes 121 and 122 may be stacked to be perpendicular to amounting surface of the composite body 300 at the time of mounting the composite body 300 on a printed circuit board.

In general, when a voltage is applied to a multilayer ceramic capacitor, a ceramic body may be repeatedly expanded and contracted in length, width, and thickness directions due to an inverse piezoelectric effect of dielectric layers.

That is, in a case of actually measuring displacement amounts of a surface (LW surface) of the ceramic body in a length-width direction, a surface (WT surface) of the ceramic body in a width-thickness direction, and a surface (LT surface) of the ceramic body in a length-thickness direction using a laser doppler vibrometer (LDV), the displacement amount is decreased in a sequence of the LW surface, the WT surface, and the LT surface.

The displacement amount of the LT surface is about 42% or so, based on that of the WT surface, such that the displacement amount of the LT surface may be smaller than that of the WT surface. The reason may be that stress having the same magnitude is generated in the LT surface and the WT surface, but particularly, since the LT surface has a relatively wide area as compared to the WT surface, stress having a similar magnitude may be distributed throughout the wide area, such that relatively small deformation may occur.

Therefore, it may be appreciated that in the general multilayer ceramic capacitor, the displacement amount is the smallest in the LT surface.

That is, according to the exemplary embodiment in the present disclosure, the first and second internal electrodes 121 and 122 may be stacked to be perpendicular to the upper and lower surfaces of the first ceramic body 110, such that at the time of mounting the composite body 300 on the printed circuit board, the first and second internal electrodes 121 and 122 may be disposed to be perpendicular to the mounting surface, thereby significantly decreasing a vibration amount of a surface of the first ceramic body 110 coming in contact with the ceramic chip 200.

However, a stacking direction of the first and second internal electrodes 121 and 122 is not limited to a direction perpendicular to the upper and lower surface of the first ceramic body 110, but the first and second internal electrodes 121 and 122 may also be stacked in a direction horizontal to the upper and lower surfaces of the first second body 110.

Meanwhile, the first and second external electrodes 131 and 132 may be formed of a conductive paste including a conductive metal, wherein the conductive metal may be nickel (Ni), copper (Cu), palladium (Pd), gold (Au), or an alloy thereof, but is not limited thereto.

Further, nickel/tin (Ni/Sn) plating layers may be further disposed on the first and second external electrodes 131 and 132.

Figure 6:
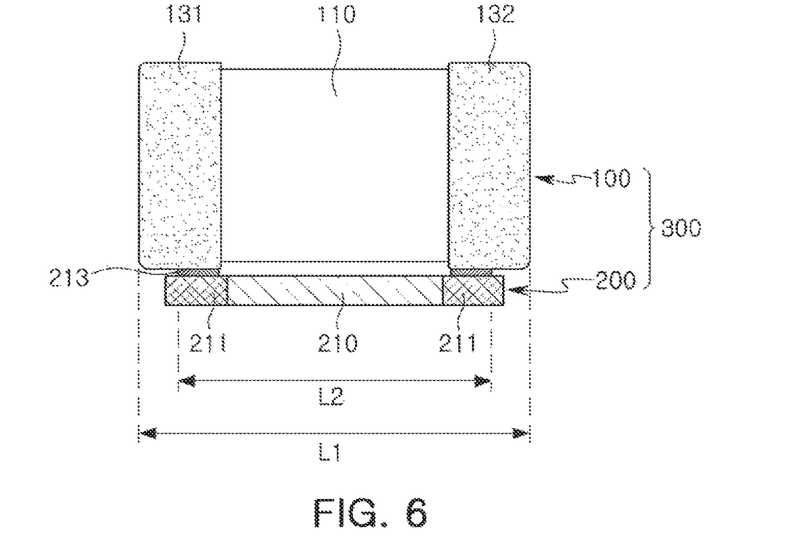
FIG. 6 is a front view illustrating the composite electronic component according to the exemplary embodiment in the present disclosure.

FIG. 6 is a front view illustrating the composite electronic component according to the exemplary embodiment in the present disclosure.

Referring to FIG. 6, in the composite electronic component according to the exemplary embodiment in the present disclosure, a length L2 of the ceramic chip 200 may be shorter than a length L1 of the multilayer ceramic capacitor 100.

The length L2 of the ceramic chip 200 may be equal to or greater than 0.6 times the length L1 of the multilayer ceramic capacitor 100, and a maximum length of the ceramic chip 200 may be equal to the length L1 of the multilayer ceramic capacitor 100.

Since the length L2 of the ceramic chip 200 is shorter than the length L1 of the multilayer ceramic capacitor 100, at the time of mounting the composite electronic component on the printed circuit board, the ceramic chip 200 may serve to allow the solder to be applied only up to the lower surfaces of the first and second external electrodes 131 and 132 in the length direction of the multilayer ceramic capacitor 100, and prevent the solder from being connected up to the multilayer ceramic capacitor 100.

Therefore, the transferring of vibrations to the printed circuit board by the solder may be further decreased.

Figure 7:
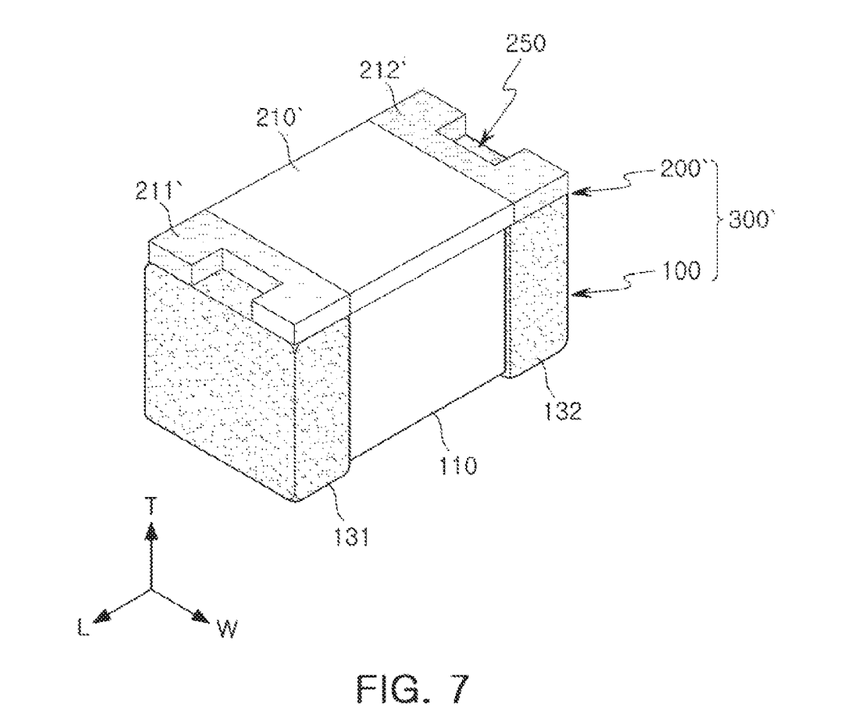
FIG. 7 is a perspective view schematically illustrating a composite electronic component according to another exemplary embodiment in the present disclosure.

FIG. 7 is a perspective view schematically illustrating a composite electronic component according to another exemplary embodiment in the present disclosure.

Referring to FIG. 7, the composite electronic component according to another exemplary embodiment in the present disclosure may include a composite body 300' in which a multilayer ceramic capacitor 100 and a ceramic chip 200' are coupled to each other, the multilayer ceramic capacitor 100 including a first ceramic body 110 in which a plurality of dielectric layers and internal electrodes disposed to face each other with respective dielectric layers interposed therebetween are stacked and first and second external electrodes 131 and 132 disposed on both end portions of the first ceramic body 110, and a ceramic chip 200' including a second ceramic body 210' disposed on a lower portion of the multilayer ceramic capacitor 100 and first and second terminal electrodes 211' and 212' disposed on both end portions of the second ceramic body 210' and connected to the first and second external electrodes 131 and 132, wherein in the ceramic chip 200', a cut portion 250 cut inwardly from both end portions of the ceramic chip 200' in a length direction is further disposed, and the first and second terminal electrodes 211' and 212' are entirely disposed on both end portions of the second ceramic body 210' in the length direction.

According to another exemplary embodiment in the present disclosure, a width of the second ceramic body 210' may be entirely uniform, and a cut portion 250 cut inwardly from both end portions of the second ceramic body 210' in the length direction may be further disposed in the second ceramic body 210'.

The portion 250 cut inwardly from both end portions thereof in the length direction may be further disposed in the second ceramic body 210', a space capable of being defined as a solder pocket may be formed.

In this case, at the time of mounting the composite electronic component according to another exemplary embodiment in the present disclosure on a printed circuit board and applying a solder, the solder may be mostly filled in the solder pocket, and the residual solder may be applied onto lower surfaces of the first and second external electrodes 131 and 132 of the multilayer ceramic capacitor 100 and side surfaces of the first and second terminal electrodes 211' and 212' of the ceramic chip 200'.

Since an amount of the solder applied onto the lower surfaces of the first and second external electrodes 131 and 132 of the multilayer ceramic capacitor 100 and the side surfaces of the first and second terminal electrodes 211' and 212' of the ceramic chip 200' is smaller than that in a structure according to the related art, the transferring of vibrations to the printed circuit board by the solder may be significantly decreased.

Further, the first and second terminal electrodes 211' and 212' may be entirely disposed on both end portions of the second ceramic body 210' in the length direction, such that adhesive force with the external electrodes 131 and 132 of the multilayer ceramic capacitor 100 may be improved.

Hereinafter, a manufacturing process of the composite electronic component according to the exemplary embodiment in the present disclosure will be described, but the manufacturing process is not limited thereto.

In the ceramic chip 200 included in the composite electronic component according to the present disclosure, first, the second ceramic body 210 formed of bulk shaped ceramic may be prepared.

The ceramic may contain alumina ($Al_2O_3$).

In the second ceramic body 210, the second region may have a shape cut in the width direction so that the width of the first region corresponding to the region in which the terminal electrodes are formed is wider than that of the second region corresponding to the central region in which the terminal electrodes are not formed.

Therefore, the second ceramic body 210 may have an H shape.

Further, the cut portion 250 may be further formed in both end portions of the second ceramic body 210 in the length direction, in which the terminal electrodes are formed.

The cut portion 250 may be formed in central portions of the second ceramic body 210 in the width direction in both end portions of the second ceramic body 210 in the length direction at a predetermined size, but is not necessarily limited thereto.

Due to the shape as described above, the spaces capable of being defined as so-called solder pockets may be formed in the second ceramic body 210 in the width and length directions.

According to another exemplary embodiment, the cut portion may be formed in both end portions of the second ceramic body 210', which has a uniform width, in the length direction.

Therefore, the second ceramic body 210' may have an I shape.

According to the present exemplary embodiment, due to a structural shape of the I shape itself, a solder pocket may be formed in both end portions of the second ceramic body 210' in the length direction.

Next, the ceramic chip 200 may be manufactured by forming the terminal electrodes 211 and 212 on both end portions of the second ceramic body 210, and perpendicularly adhered to the multilayer ceramic capacitor 100 manufactured in advance.

A coupling method of the ceramic chip 200 and the multilayer ceramic capacitor 100 may be various, and is not particularly limited.

As an example of the coupling method, a central region of the second ceramic body in which the terminal electrodes are not formed may be applied with an insulating adhesive such as an epoxy resin, or the like, to thereby be coupled to a region of the first ceramic body 110 on which the external electrodes are not formed, and then, a composite body of the ceramic chip on which the terminal electrodes are formed and the multilayer ceramic capacitor may be formed by applying a conductive paste and performing a plating process.

As another example, a high melting point solder or conductive adhesive may be applied onto regions of the terminal electrodes of the ceramic chip 200 in which the terminal electrodes are formed, thereby coupling the ceramic chip 200 and the multilayer ceramic capacitor 100 to each other while contacting the first and second external electrodes 131 and 132 of the multilayer ceramic capacitor 100.

Board Having Composite Electronic Component

Figure 8:
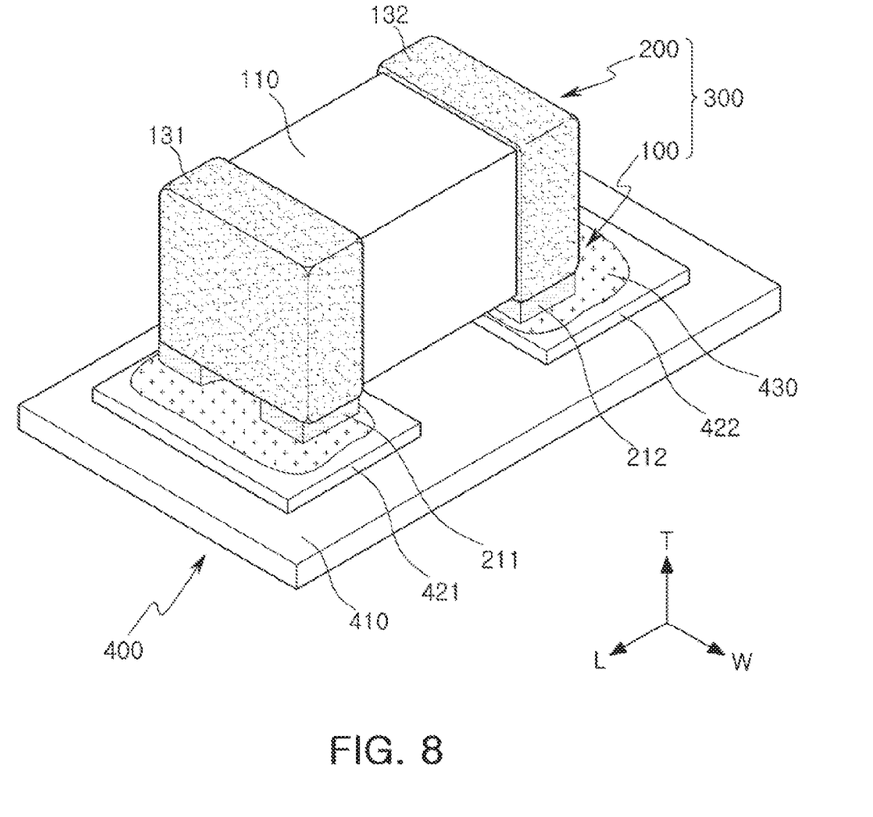
FIG. 8 is a perspective view illustrating a board in which the composite electronic component of FIG. 1 is mounted on a printed circuit board.

FIG. 8 is a perspective view illustrating a board in which the composite electronic component of FIG. 1 is mounted on a printed circuit board.

Figure 9:
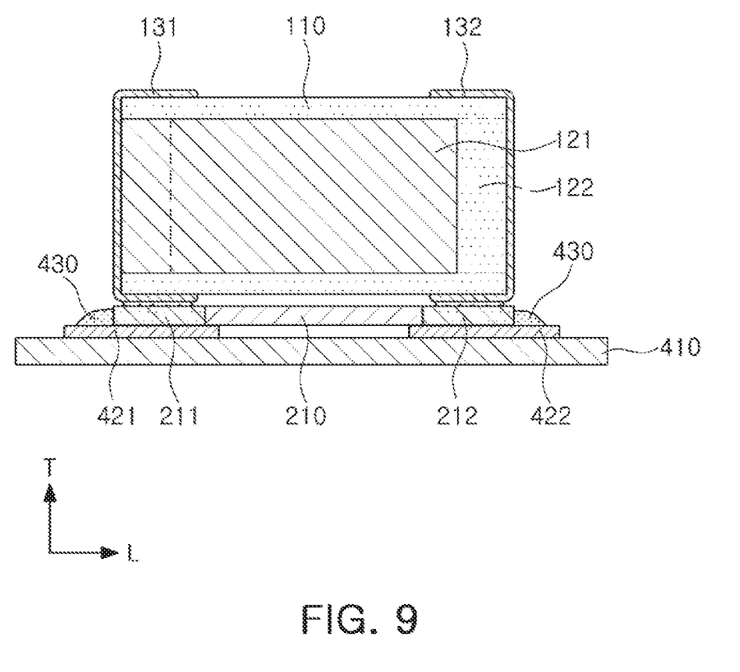
FIG. 9 is a cross-sectional view illustrating the board in which the composite electronic component of FIG. 8 is mounted on the printed circuit board, taken in a length direction.

FIG. 9 is a cross-sectional view illustrating the board in which the composite electronic component of FIG. 8 is mounted on the printed circuit board, taken in a length direction.

Referring to FIGS. 8 and 9, a board 400 having a composite electronic component according to the present exemplary embodiment may include a printed circuit board 410 on which the composite electronic component is mounted, and two electrode pads 421 and 422 formed on an upper surface of the printed circuit board 410.

The electrode pads 421 and 422 may be composed of first and second electrode pads 421 and 422 connected to the first and second terminal electrodes 211 and 212 of the ceramic chip 200 of the composite electronic component, respectively.

In this case, the first and second terminal electrodes 211 and 212 of the ceramic chip 200 may be electrically connected to the printed circuit board 410 by solder 430 in a state in which first and second terminal electrodes 211 and 212 are positioned to contact the first and second electrode pads 421 and 422, respectively.

When a voltage is applied in a state in which the composite electronic component is mounted on the printed circuit board 410 as described above, acoustic noise may be generated.

That is, when voltages having different polarities are applied to the first and second external electrodes 131 and 132 disposed on both end surfaces of the multilayer ceramic capacitor 100 of the composite electronic component in the length direction in a state in which the composite electronic component is mounted on the printed circuit board 410, the first ceramic body may be expanded and contracted in a thickness direction by an inverse piezoelectric effect of the dielectric layer 111, and both side portions of the first and second external electrodes 131 and 132 may be contracted and expanded by the Poisson effect, as opposed to expansion and contraction of the first ceramic body 110 in the thickness direction.

Here, since the composite electronic component according to the exemplary embodiment in the present disclosure is manufactured so that the width of the first region 210a of the second ceramic body 210 in which the first and second terminal electrodes 211 and 212 are disposed is wider than the width of the second region (the other region) 210b of the second ceramic body 210, and the width of the second region 210b of the second ceramic body 210 is narrower than the width of the first ceramic body 110 corresponding thereto, even though an amount of solder is large at the time of mounting the composite electronic component on the printed circuit board, a problem that the solder rises along the first and second external electrodes 131 and 132 of the multilayer ceramic capacitor 100 may be prevented, thereby blocking piezoelectric stress from being directly transferred from the multilayer ceramic capacitor 100 to the printed circuit board through the first and second external electrodes 131 and 132. Therefore, acoustic noise may be further decreased.

That is, at the time of mounting the composite electronic component on the printed circuit board, the transferring of vibrations of the capacitor due to the inverse piezoelectric properties of the capacitor to the printed circuit board may be decreased, such that acoustic noise may be decreased.

As set forth above, according to exemplary embodiments in the present disclosure, stress or vibrations due to the piezoelectric property of the multilayer ceramic capacitor may be alleviated by the ceramic chip, such that an intensity of the acoustic noise generated in the printed circuit board may be decreased.

Further, the internal electrodes of the multilayer ceramic capacitor may be stacked in a direction perpendicular to the mounting surface, and a surface of the multilayer ceramic capacitor in the length-width direction, of which a piezoelectric displacement amount is small, may be adhered to the ceramic chip, such that the transferring of stress and vibrations generated in the multilayer ceramic capacitor to the ceramic chip may be significantly decreased, thereby decreasing acoustic noise, In addition, the cut portion may be formed inwardly from both end portions of the ceramic chip in the width or length direction, and the width and length directions, such that formation of the solder in the thickness direction of the multilayer ceramic capacitor may be blocked, and thus, the transferring of vibrations to the printed circuit board by the solder may be significantly decreased.

Further, the terminal electrodes disposed on the ceramic chip may be entirely disposed on both end portions of the ceramic chip in the length direction, such that adhesive force with the external electrodes of the multilayer ceramic capacitor may be improved.

While exemplary embodiments have been shown and described above, it will be apparent to those skilled in the art that modifications and variations could be made without departing from the scope of the present invention as defined by the appended claims.

What is claimed is:

1. A composite electronic component comprising a composite body in which a multilayer ceramic capacitor and a ceramic chip are coupled to each other, the multilayer ceramic capacitor including a first ceramic body in which a plurality of dielectric layers and internal electrodes disposed to face each other with respective dielectric layers interposed therebetween are stacked, and first and second external electrodes disposed on both end portions of the first ceramic body; and the ceramic chip including a second ceramic body disposed on a lower portion of the multilayer ceramic capacitor, and first and second terminal electrodes disposed on both end portions of the second ceramic body and connected to the first and second external electrodes, wherein a width of first regions of the second ceramic body in which the first and second terminal electrodes are disposed is wider than a width of a second region of the second ceramic body between the first regions.

2. The composite electronic component of claim 1, wherein in a cross-section cut perpendicular to a length direction, the width of the second region of the second ceramic body is narrower than a width of the first ceramic body.

3. The composite electronic component of claim 1, wherein the ceramic chip has a cut portion cut inwardly from both end portions of the ceramic chip in a length direction.

4. The composite electronic component of claim 1, wherein the internal electrodes are stacked to be perpendicular or horizontal to a mounting surface of the composite body.

5. The composite electronic component of claim 1, wherein the multilayer ceramic capacitor and the ceramic chip are coupled to each other by a conductive adhesive applied onto lower surfaces of the first and second external electrodes.

6. The composite electronic component of claim 1, wherein the multilayer ceramic capacitor and the ceramic chip are coupled to each other by an insulating adhesive applied between a lower surface of the first ceramic body and an upper surface of the second ceramic body.

7. The composite electronic component of claim 1, wherein the first and second terminal electrodes are entirely disposed on both end portions of the second ceramic body in a length direction.

8. The composite electronic component of claim 1, wherein a length of the ceramic chip is shorter than that of the multilayer ceramic capacitor.

9. The composite electronic component of claim 8, wherein the length of the ceramic chip is equal to or greater than 0.6 times the length of the multilayer ceramic capacitor.

10. A board having a composite electronic component, the board comprising:
a printed circuit board on which a plurality of electrode pads are formed;
the composite electronic component of claim 1 mounted on the printed circuit board; and
a solder connecting the electrode pads and the composite electronic component to each other.

11. The board of claim 10, wherein the ceramic chip has a cut portion cut inwardly from both end portions of the ceramic chip in a length direction, and
the solder fills the cut portion.

12. The board of claim 10, wherein the multilayer ceramic capacitor and the ceramic chip are coupled to each other by another solder disposed between the first and second external electrodes of the ceramic capacitor and the first and second terminal electrodes of the ceramic chip, and
a melting temperature of the solder connecting the electrode pads and the composite electronic component is less than a melting temperature of the another solder coupling the ceramic capacitor and the ceramic chip.

* * * * *